United States Patent [19]
Kametani

[11] Patent Number: 5,968,150
[45] Date of Patent: *Oct. 19, 1999

[54] PROCESSOR ELEMENT HAVING A PLURALITY OF CPUS FOR USE IN A MULTIPLE PROCESSOR SYSTEM

[75] Inventor: Masatsugu Kametani, Ibaraki-ken, Japan

[73] Assignee: Hitachi, Ltd., Tokyo, Japan

[*] Notice: This patent is subject to a terminal disclaimer.

[21] Appl. No.: 08/454,568

[22] Filed: May 30, 1995

Related U.S. Application Data

[63] Continuation of application No. 08/182,695, Jan. 13, 1994, Pat. No. 5,568,617, which is a continuation of application No. 07/636,562, Jan. 7, 1991, Pat. No. 5,297,260, which is a continuation of application No. 07/471,801, Dec. 15, 1989, abandoned, which is a continuation of application No. 07/013,548, Feb. 11, 1987, abandoned.

[30] Foreign Application Priority Data

Mar. 12, 1986 [JP] Japan .................................. 61-52448
Oct. 20, 1986 [JP] Japan .................................. 61-247436

[51] Int. Cl.⁶ .......................... G06F 13/364; G06F 15/16
[52] U.S. Cl. .................... 710/100; 710/108; 710/110; 710/113; 710/131; 711/147; 711/149; 364/132
[58] Field of Search .................................. 395/800, 325, 395/200, 725; 364/131–138, 132, 133; 710/100, 108, 110, 113, 131; 711/147, 149

[56] References Cited

U.S. PATENT DOCUMENTS

| | | | |
|---|---|---|---|
| 3,765,969 | 10/1973 | Kragness et al. | 156/17 |
| 3,932,841 | 1/1976 | Deerfield et al. | 395/325 |
| 4,058,711 | 11/1977 | Ondercin et al. | 395/800 X |
| 4,151,592 | 4/1979 | Suzuki et al. | 395/325 |
| 4,153,942 | 5/1979 | Gregory | 364/DIG. 2 X |
| 4,164,787 | 8/1979 | Aranguren | 364/DIG. 1 X |
| 4,172,283 | 10/1979 | Kober | 364/DIG. 1 X |

(List continued on next page.)

FOREIGN PATENT DOCUMENTS

| | | |
|---|---|---|
| 0123509 | 4/1984 | European Pat. Off. . |
| 0213509 | 4/1984 | European Pat. Off. . |

(List continued on next page.)

OTHER PUBLICATIONS

Lowenthal, Richard, "Floating Point Microprocessor Implemented as Optional Co–Processor", *Computer Design*, Mar. 1981, vol. 20, No. 3, pp. 178–182.

Wyland, David C., "Dual–Port RAMs Simplify Communication in Computer Systems", Application Note AN–02, *Integrated Device Technology, Inc.,* 1986.

"CMOS Dual Port RAM", Preliminary Specification IDT71305, *Integrated Device Technology, Inc.,* 1985, pp. 1–87, 1–74–1–75.

"Nachrichtentechnik Elektronik", 1979, vol. 29, No. 7, pp. 271–276.

"Electronics Design", Jul. 26, 1984, pp. 155–166.

*Webster's Ninth New Collegiate Dictionary,* copyright 1986 by Marriam–Webster, Inc., p. 938.

R.W. Johnson et al, "Silicon Hybrid Water–Scale Package Technology", *IEEE Journal of Solid–State Circuits,* Oct. 1986, vol. SC–21, No. 5.

(List continued on next page.)

*Primary Examiner*—Paul V. Kulik
*Attorney, Agent, or Firm*—Antonelli, Terry, Stout & Kraus, LLP

[57] ABSTRACT

A processor for constructing a single processor system or multiprocessor system comprises, within a base processor element constituting the processor, two CPU with associated local memories, a dual-port RAM accessible from said CPUs, and a common bus switch circuit for connecting any one of said CPUs to a common bus shared by said CPUs.

27 Claims, 7 Drawing Sheets

5,968,150
Page 2

U.S. PATENT DOCUMENTS

| | | | |
|---|---|---|---|
| 4,204,251 | 5/1980 | Brudevold | 364/DIG. 1 X |
| 4,214,305 | 7/1980 | Tokita et al. | 364/DIG. 1 X |
| 4,215,395 | 7/1980 | Bunyard et al. | 364/134 |
| 4,237,534 | 12/1980 | Felix | 364/DIG. 1 X |
| 4,257,095 | 3/1981 | Nadir | 364/DIG. 1 X |
| 4,270,167 | 5/1981 | Koehler et al. | 395/325 |
| 4,422,142 | 12/1983 | Ihaba et al. | 364/DIG. 1 X |
| 4,443,846 | 4/1984 | Adcock | 364/DIG. 1 X |
| 4,470,109 | 9/1984 | McNally | 364/DIG. 1 X |
| 4,495,567 | 1/1985 | Treen | 364/DIG. 1 X |
| 4,495,569 | 1/1985 | Kagawa | 364/DIG. 1 X |
| 4,542,397 | 9/1985 | Birgelsen et al. | 357/32 |
| 4,549,273 | 10/1985 | Tin | 364/DIG. 1 X |
| 4,590,549 | 5/1986 | Burrage et al. | 364/DIG. 1 X |
| 4,594,657 | 6/1986 | Byrns | 364/DIG. 1 X |
| 4,604,161 | 8/1986 | Araghi | 156/645 |
| 4,628,436 | 12/1986 | Okamoto et al. | 364/DIG. 1 X |
| 4,668,333 | 5/1987 | Tandun et al. | 156/633 |
| 4,671,846 | 6/1987 | Shimbo et al. | 156/629 |
| 4,682,285 | 7/1987 | Ozil et al. | 364/DIG. 1 X |
| 4,698,253 | 10/1987 | Hubbins et al. | 364/DIG. 1 X |
| 4,698,753 | 10/1987 | Hubbins et al. | 364/200 |
| 4,737,932 | 4/1988 | Baba | 364/DIG. 2 X |
| 4,747,060 | 5/1988 | Sears, III et al. | 364/134 X |
| 4,830,985 | 5/1989 | Araghi et al. | 437/209 |
| 4,868,068 | 9/1989 | Yamaguchi et al. | 428/546 |
| 4,883,215 | 11/1989 | Geosele et al. | 228/116 |
| 4,912,633 | 3/1990 | Schweizer | 364/DIG. 1 X |
| 4,953,074 | 8/1990 | Kametani et al. | 364/132 X |
| 4,961,821 | 10/1990 | Drake et al. | 156/647 |
| 4,962,879 | 10/1990 | Goesele et al. | 228/116 |
| 4,990,462 | 2/1991 | Sliwa, Jr. | 437/51 |
| 5,045,142 | 9/1991 | Drake et al. | 156/278 |
| 5,297,260 | 3/1994 | Kametani | 395/325 |
| 5,549,273 | 10/1985 | Tin | 364/200 |
| 5,568,617 | 10/1996 | Kametani | 395/280 |

FOREIGN PATENT DOCUMENTS

| | | |
|---|---|---|
| 53-93746 | of 0000 | Japan . |
| 51-54753 | 5/1976 | Japan . |
| 51-60430 | 5/1976 | Japan . |
| 54-50329 | 4/1979 | Japan . |
| 56-145494 | 11/1981 | Japan . |
| 57-136203 | 8/1982 | Japan . |
| 57-152065 | 9/1982 | Japan . |
| 57-162056 | 10/1982 | Japan . |
| 57-174747 | 10/1982 | Japan . |
| 58-87645 | 5/1983 | Japan . |
| 58-211271A | 12/1983 | Japan . |
| 59-167730 | 9/1984 | Japan . |
| 59-220821 | 12/1984 | Japan . |
| 60-33643 | 2/1985 | Japan . |
| 60-120484 | 6/1985 | Japan . |
| 60-173655A | 9/1985 | Japan . |
| 60-254358A | 12/1985 | Japan . |
| 61-11876A | 1/1986 | Japan . |
| 61-52767A | 3/1986 | Japan . |
| 62-147746 | 7/1987 | Japan . |
| 2184063 | 7/1990 | Japan . |
| 3062588 | 3/1991 | Japan . |
| 3214764 | 9/1991 | Japan . |
| 53-93746 | 3/1992 | Japan . |
| 57-130136 | 8/1992 | Japan . |
| 2134676 | 8/1984 | United Kingdom . |

OTHER PUBLICATIONS

*Nikkei Microdevices*, Nikkei, McGraw–Hill, Inc. Apr. 1, 1986, pp. 45–46.

*Hitachi Microcomputer General User's Guide,* Feb. 1991, p. 121.

Grof, "Modern Dictionary of Electronics 6th Edition", *Howard W. Sams Co., Inc.*1984.

*Electronics Design* , Jul. 26, 1984, pp. 155–156.

Lowenthal Richard, "Floating Point Microprocessor Implemented as Optional Co. Processor", *Computer Design* , vol. 20, No. 3, Mar. 1981, pp. 178–182.

*Webster's Ninth New Collegiate Dictionary* , copyright 1986 by Marriam–Webster Inc., p. 938.

PROCESSOR ELEMENT HAVING A PLURALITY OF CPUS FOR USE IN A MULTIPLE PROCESSOR SYSTEM

This application is a Continuation of application Ser. No. 08/182,695, filed Jan. 13, 1994; now U.S. Pat. No. 5,568,617, which is a Continuation of application Ser. No. 07/636,562, filed Jan. 7, 1991 now U.S. Pat. No. 5,297,260; which is a Continuation of application Ser. No. 07/471,801, filed Dec. 15, 1989, now abandoned; which is a Continuation of application Ser. No. 07/013,548, filed Feb. 11, 1987, now abandoned.

BACKGROUND OF THE INVENTION

This invention relates to a processor suitable for constructing a single processor system or multiprocessor system.

A conventional multiprocessor system, as shown for example in U.S. Pat. No. 4,494,188, consists primarily of a CPU, a memory, and a common bus switch which operates on a master-slave basis with other processor elements. Such a multiprocessor system, configured by single-CPU processor elements, operates favorably so far as a customized task process with few disturbances is concerned. However, as the process performed by the system becomes more sophisticated, such as in the case of an intellectualized control process, overhead system supports including the management of the data base and system status, the organization of the intelligent processing system based on the data base or sensor information, multi-interrupt processing, and multijob functions, are rendered indispensable, and in general these processes are programmed by a high grade language and executed under a high grade operating system with realtime multitasking and multijob supporting abilities.

In the above-mentioned conventional multiprocessor system, the realtime control process, which is the main object of speedup, is treated as one of tasks carried out by multitasking, and therefore at present the system cannot implement a tight-linked parallel processing due to the task switching overhead and disordered parallel processing schedule.

Because of this, the intelligent processing system is often separated from the parallel-processed control processing system by employment of a super minicomputer as a supervisory system, but in this case, there are several problems, as follows;

(1) communication between the control processing system and intelligent processing system is apt to become less frequent; therefore, the advantages of distributed intelligent processing and system management, which generally necessitate operating system overhead for controlling the internal status of each processor, are not effectively exerted, resulting in a degraded cost-effectiveness evaluation, and (2) it is difficult to expand the processing ability of the intelligent processing system to match the expansion of the processing ability of the control processing system and also difficult to improve the communication throughput between the two systems. Accordingly, when specifically the control loop of the control processing system is sped up, a relatively large amount of data needs to be transacted between the intelligent processing system and the control processing system, but this is impeded by the hardware restriction due to the above-mentioned problems, resulting in a significant deterioration in cost effectiveness.

SUMMARY OF THE INVENTION

An object of this invention is to provide a processor capable of improving, with well balanced and efficient qualities, the processing ability of a multiprocessor or single processor system which is suitable for versatile processing.

The above object is achieved by a processor constituted by a base processor element which includes two CPUs with individual associated local memories, a dual-port RAM (DPR) accessible from the CPUs, and a common bus switch circuit which connects one of the CPUs to a common bus shared by the CPUs.

The inventive processor provides a hardware architecture which allows the two CPUs in the base processor element to operate as if they are a single processor. With attention being paid to the high independency of the control processing system and intelligent processing system based on the data base and sensor information, the control processing system is alloted to the main processing system with the main CPU so that control arithmetics are implemented by the tight-linked parallel processing in unison with other base processor elements, while the intelligent processing system, for dealing with overhead processings including the interrupt process, system management and intelligent process, is alloted to the background processing system of the main CPU and to the background CPU so as to backup the control processing system of the main CPU. In consequence, the task switching overhead and interrupt events which disturb the parallel processing for the control processing system are eliminated as much as possible, and the two highly independent processing systems are operated in parallel efficiently, whereby the processing ability of the base processor element is virtually doubled by addition of the processing ability of two CPUs, and also in a multiprocessor system where several base processor elements are linked the total processing ability is doubled as compared with the conventional system and the processing ability can be expanded, at well balanced grades between the control processing system and the intelligent processing system as the number of base processor elements is increased.

Other objects and features of this invention will be more apparent from the following description of certain preferred embodiments of the invention.

DESCRIPTION OF THE PREFERRED EMBODIMENTS

The invention will now be described in detail with reference to the drawings.

Figure 1:
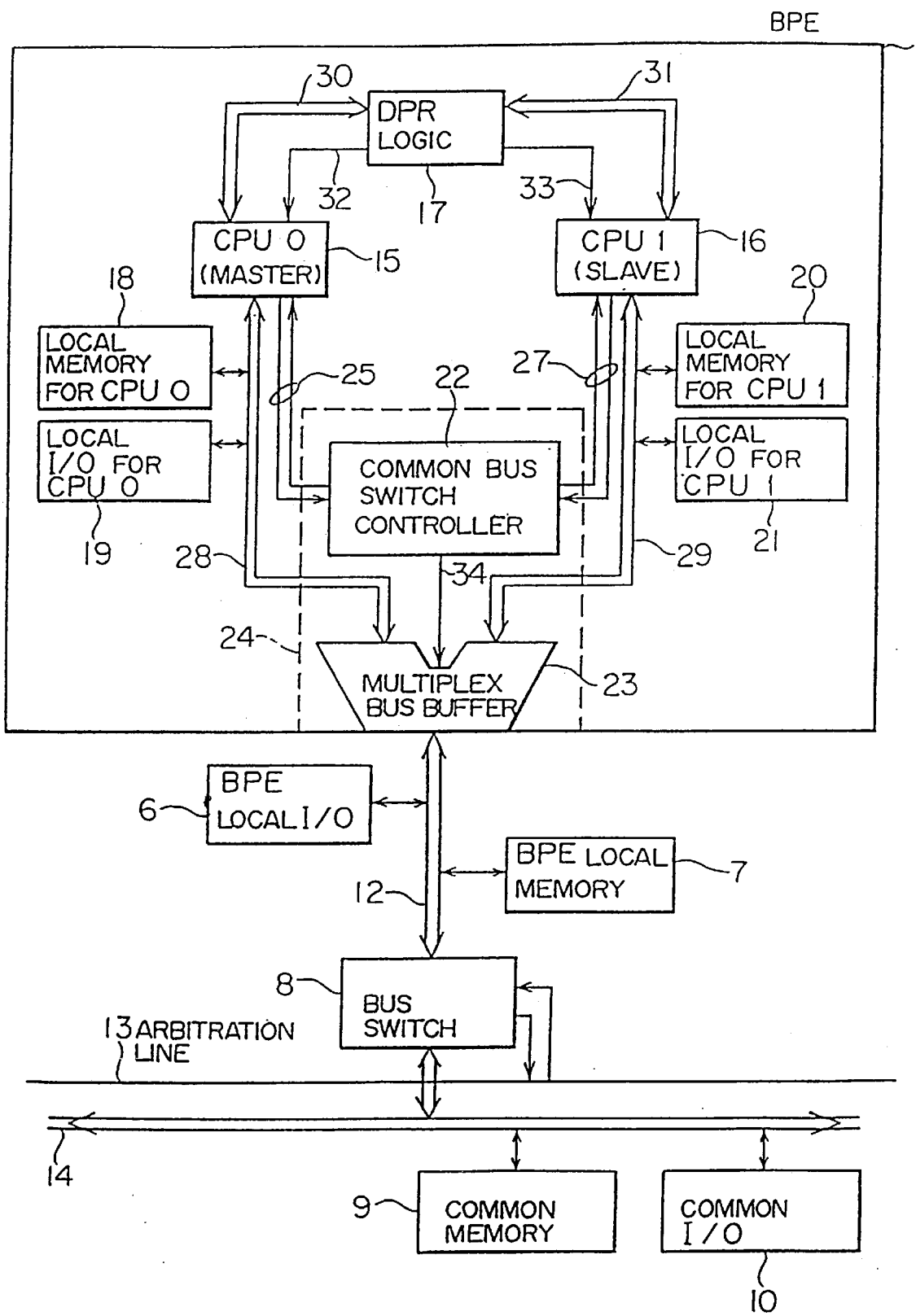
FIG. 1 is a block diagram showing the internal arrangement of the base processor element according to this invention and part of the multiprocessor system configured by the base processor element.

In FIG. 1, showing the arrangement of the inventive processor, a base processor element (BPE) 1 for organizing a multiprocessor system includes two CPUs 15 and 16 (CPU0 and CPU1), a dual-port RAM (DPR) 17 as a communication facility between the CPUs 15 and 16, and a common bus switch 24 including a multiplex bus buffer 23 which is controlled consistently by a common bus switch control circuit 22 for connecting either of the CPUs to a BPE local bus 12 shared by the CPUs for establishing communication with other base processor elements (BPEs). The CPUs 15 and 16 are associated with local memories 18 and 20 and local input/output (I/O) units 19 and 21, respectively, so that they can operate independently. The dual-port RAM (DPR) 17, which supports the communication between the CPUs via buses 30 and 31, also has communication interrupt lines 32 and 33 to the CPUs 15 and 16 respectively, allowing inter-CPU communication with little overhead. The local bus 12 of the base processor element 1 is connected with a local memory 7 and local I/O unit 6 associated with the base processor element, and at the same time the bus 12 constitutes a common bus line for connection with other base processor elements. Further provided on the local bus 12 is a system bus switch 8 which connects the base processor element to a system bus 14 on which a common system memory 9 and common system I/O unit 10 are connected. The system bus switch 8 implements the bus arbitration process for system bus requests by using an arbitration line 13 so that the common resources on the system bus 14 are used properly and parallel processing is carried out among the base processor elements through the communication process with other base processor elements.

Figure 5:
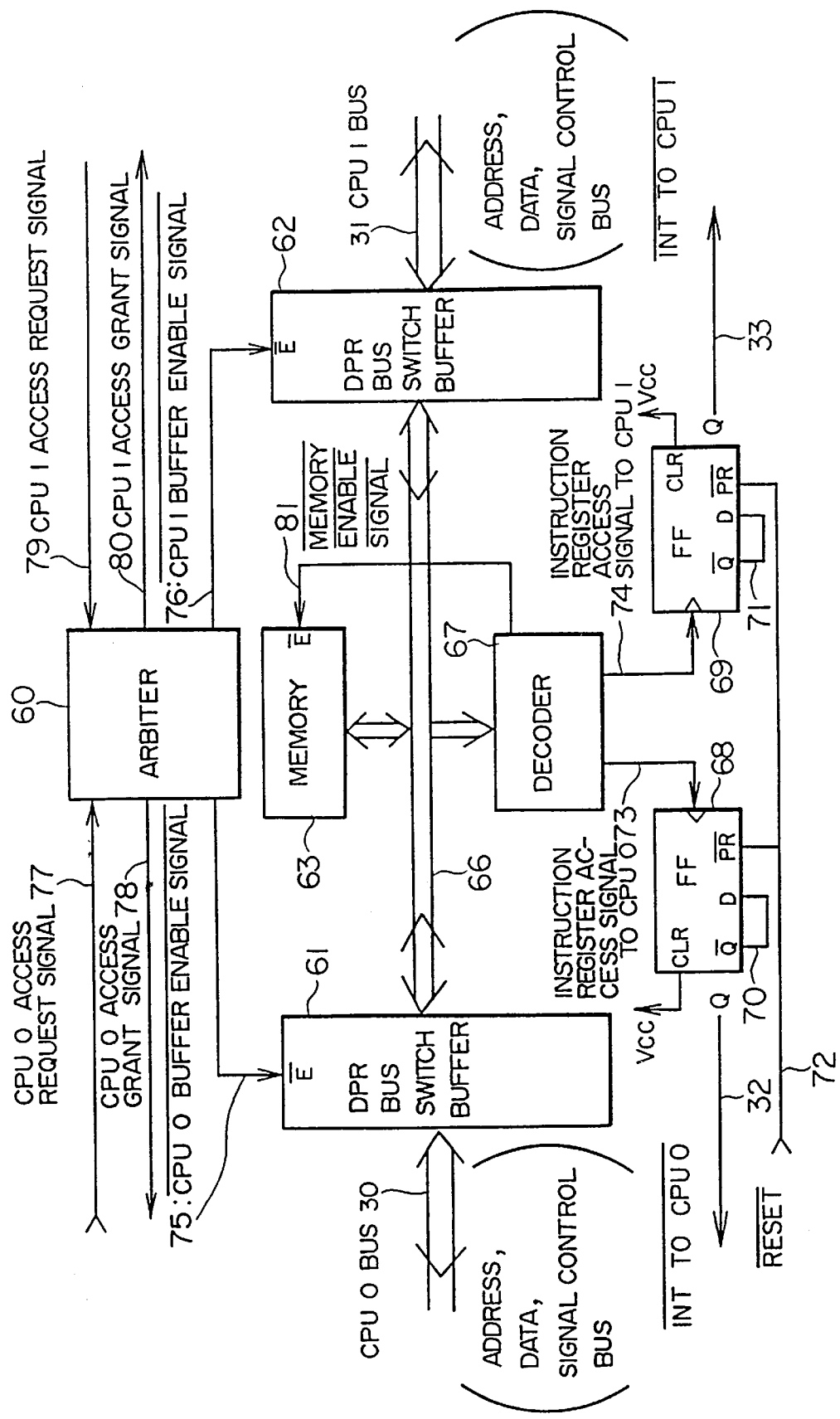
FIG. 5 is a block diagram of the dual-port RAM according to this invention.

FIG. 5 shows in block diagram form the dual-port RAM (DPR) 17, which can be regarded as a memory shared by the CPUs 15 and 16. The DPR 17 includes an arbiter 60 which implements arbitration for the CPUs 15 and 16 in making access to the dual-port RAM (DPR) by using access request signals and access grant signals symbolized as 77 through 80 for each processor, bus switches 61 and 62 which selectively connect the CPU bus 30 or 31 to the internal bus 66 in accordance with the enable signal 75 or 76 issued by the arbiter 60, a decoder 67 which decodes the address and control signals on the internal bus 66 to produce the memory enable signal 81 and interrupt control signals 73 and 74, and flip-flops 68 and 69 which set or reset the interrupt signals 32 and 33 in response to the interrupt control signals 73 and 74 produced by the decoder 67. The dual-port RAM (DPR) has a unique interrupt function for inter-CPU communication, which establishes a register for generating an interrupt to CPU0 and a register for generating an interrupt to CPU1 at certain addresses of the DPR, and at the same time defines these registers to be instruction registers directed to the partner CPUs, thereby implementing instruction reception and interrupt generation at the same time. In an example of instruction issuance by CPU1 to CPU0, the CPU1 initially sets the attribute of the instruction to be executed by CPU0 in its own register and then stores it in the instruction register (interrupt generation register) directed to CPU0 in the DPR, then the decoder 67 knows, by monitoring and decoding the internal bus 66 of the DPR, that the instruction register directed to CPU0 is accessed, and sends the instruction register access signal to CPU0 by using the access signal 73 so that the value of the $\overline{Q}$ signal 70 is latched in the flip-flop 68. Since the flip-flop 68 has been initialized to Q=high and $\overline{Q}$=low by the reset signal 72, the above operation causes the flip-flop to produce Q=low and $\overline{Q}$=high, and the low-active interrupt signal 32 to CPU0 is activated.

Accepting the interrupt, CPU0 again makes reference to the instruction register directed to it in order to fetch an instruction to be executed in its own interrupt service routine, and when it reads out an indicated instruction, the decoder 67, which constantly monitors the access situation, provides an instruction register access signal for CPU0 to the flip-flop 68 by using the access signal 73 so as to latch a high $\overline{Q}$ output 70 and output a high to Q. Namely, the interrupt generation line 32 to CPU0 is deactivated. By the foregoing sequence, a series of operations from interrupt generation to interrupt acceptance and operations related to instruction reception on a software basis are carried out concurrently and at a minimal overhead.

Figure 4:
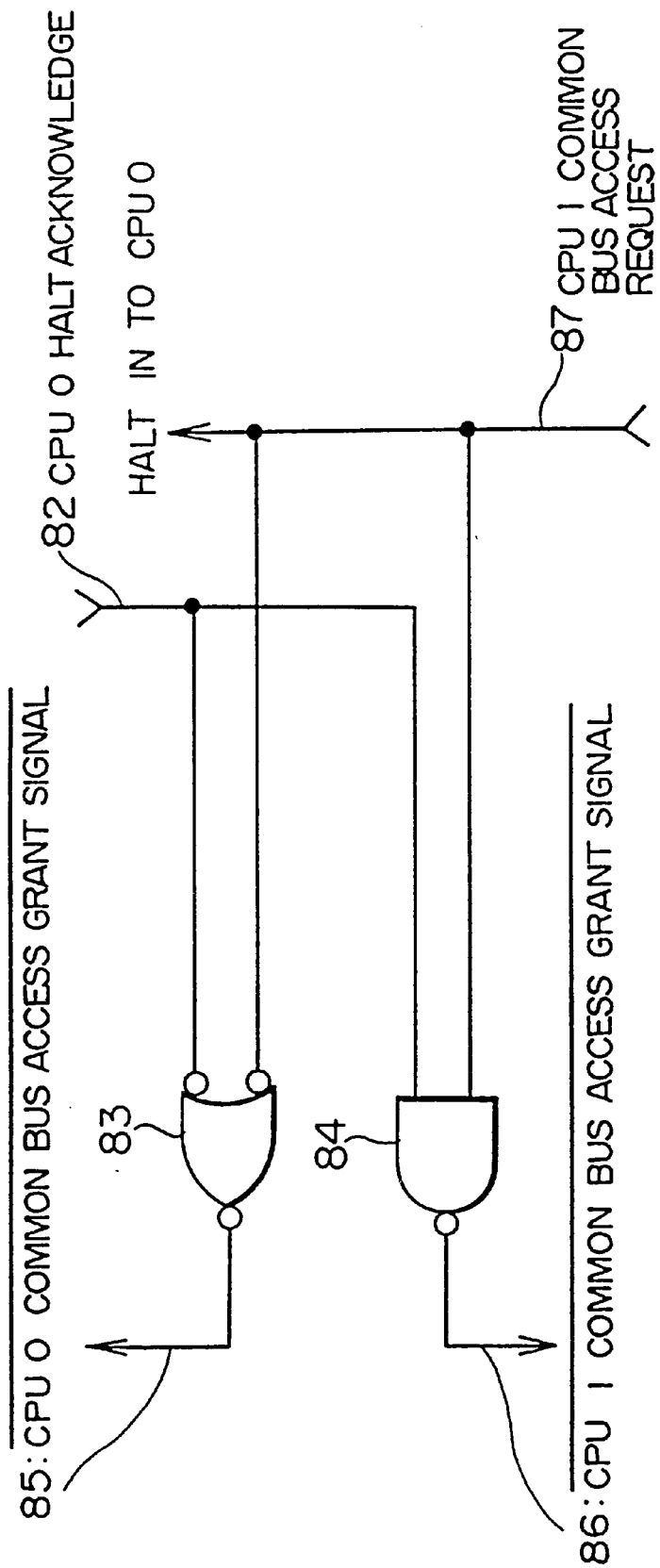
FIG. 4 is a basic logic diagram of the common bus switch according to this invention.

Returning to FIG. 1, the common bus switch 24, which selects one of the buses 28 and 29 of CPU0 and CPU1 in the base processor element (BPE) 1 and implements bus switching control for the output to the BPE local bus 12 regarded as a shared bus for CPU0 and CPU1, consists of the aforementioned common bus switching control circuit 22 and the multiplex bus buffer 23 controlled by the circuit 22. The bus switching control, for the case of a master CPU0 and slave CPU1, is implemented by a common bus switching logic made up of a NOR gate 83 and a NAND gate 84 as shown in FIG. 4.

Figure 2:
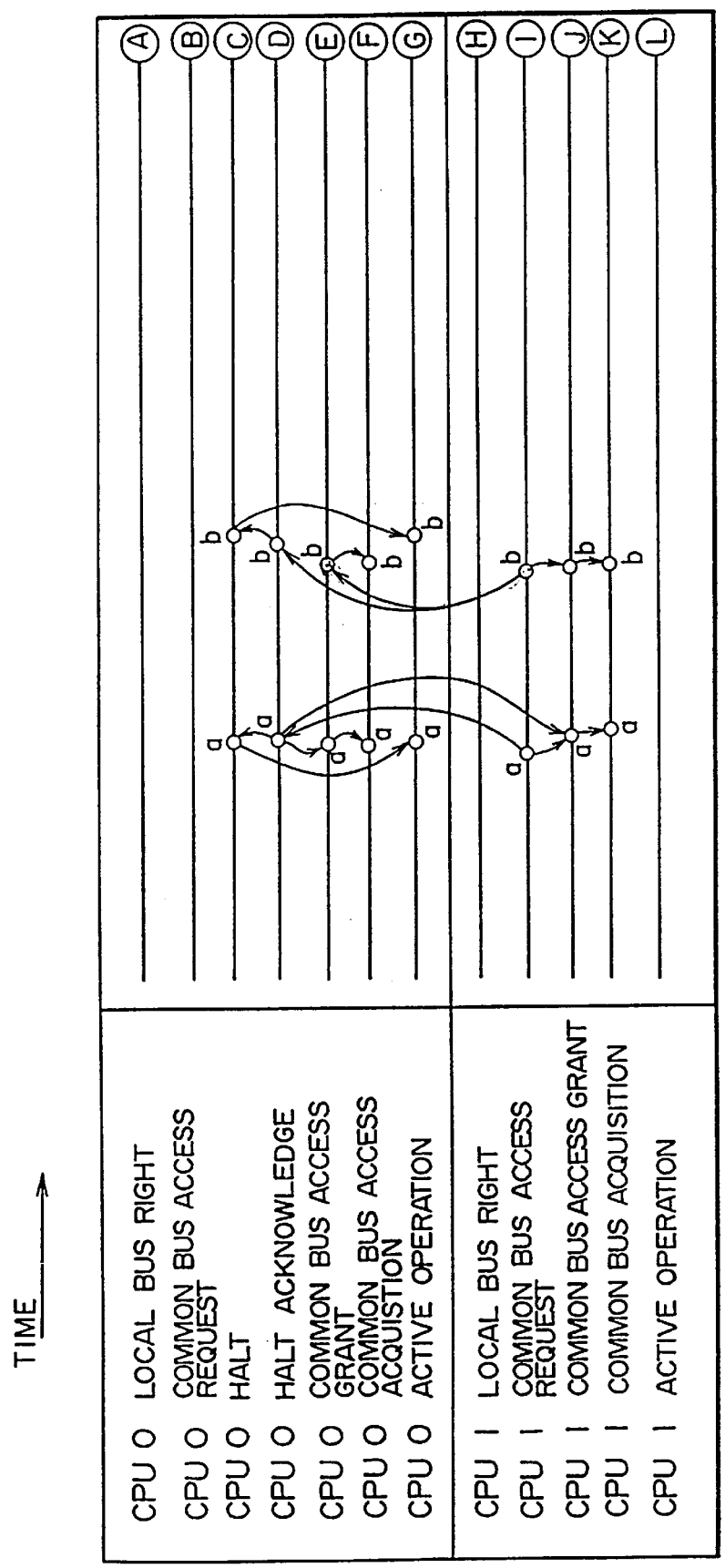
FIG. 2 is a diagram showing the switching sequence for the common bus (BPE local bus) shared by the two CPUs in the base processor element according to this invention.

The following describes the unique bus switching control sequence in connection with the timing chart of FIG. 2. Initially, the access right for the two CPU local buses 28 and 29 always resides on the CPU side and it is never infringed by other devices on the bus Ⓐ, Ⓗ. The common bus (BPE local bus 12) access request by CPU0 is always active as shown by Ⓑ, while that of CPU1 is made active when necessary as shown by Ⓘ. Namely, CPU0 normally takes the bus, except only when CPU1 is using it. In the example shown in FIGS. 2 and 4, the CPU1 raises a common bus access request 87 at Ⓘa, and CPU0 responds to the request to terminate the instruction process at that time point and output a halt acknowledge 82 immediately when it becomes possible to release the bus right at Ⓓa and then deactivates the CPU0's common bus access grant signal 85 (driven by the gate 83) at Ⓔa and releases the bus as shown by Ⓕa. At Ⓒa, CPU0 enters the halt state and at the same time at Ⓙa the CPU1's common bus access grant signal 86 (driven by the gate 84) is activated, causing the bus switch buffer 23 to be selected on the CPU1 side as shown by Ⓚa, and the bus right is passed to CPU1. When the time comes when CPU1 can release the common bus following the use, it deactivates the CPU1's common bus access request 87 as shown by Ⓘb. This is immediately followed by the active transition of the CPU0's common bus access grant signal 85 at Ⓔb, causing the bus switch buffer 23 to be selected on the CPU0 side, and after the bus right is passed to CPU0 its halt acknowledge is reset at Ⓓb and CPU0 makes a transition from the halt state to the active state at Ⓒb. In the timing chart, symbols Ⓖ and Ⓛ indicate the active states of CPU0 and CPU1, respectively. In the foregoing master (CPU0) and slave (CPU1) operation, CPU0 is in the halt state for a duration between Ⓕa and Ⓕb when the bus right is held by CPU1 and a little while between Ⓕb and Ⓖb for the bus switch timing adjustment. Accordingly, during those intervals CPU1 rather than CPU0 behaves as master from the viewpoint of activity right. A mode is provided to pass the bus right to CPU0 at each data transfer so that CPU0 is not precluded from operating due to too long a halt time. However, as will be described later, for a multiprocessor system using CPU1 as a background CPU for implementing intelligent processing for supporting the main CPU0, adoption of a distributed intelligent base configuration of the functional structure in units of base processor element (BPE) allows each processor to receive most of necessary data in its neighborhood and to have most of data communication through the dual-port RAM (DPR). On this account, transaction of intelligent information among base processor elements (BPEs) is less frequent than information transaction by CPU0 with other base processor element (BPEs) for the purpose of tight-linked parallel processing, and therefore loss of processing ability of CPU0 according to this invention is conceivably small. In another case where CPU1 has a fixed role to back up CPU0 and performs system management, it is more efficient for the system to have the CPU0's operation control right committed to CPU1, and the inventive common bus control is suited for the local distributed processing as described above.

The general operation of the foregoing inventive processor will be described in detail with reference to FIG. 3.

Figure 3:
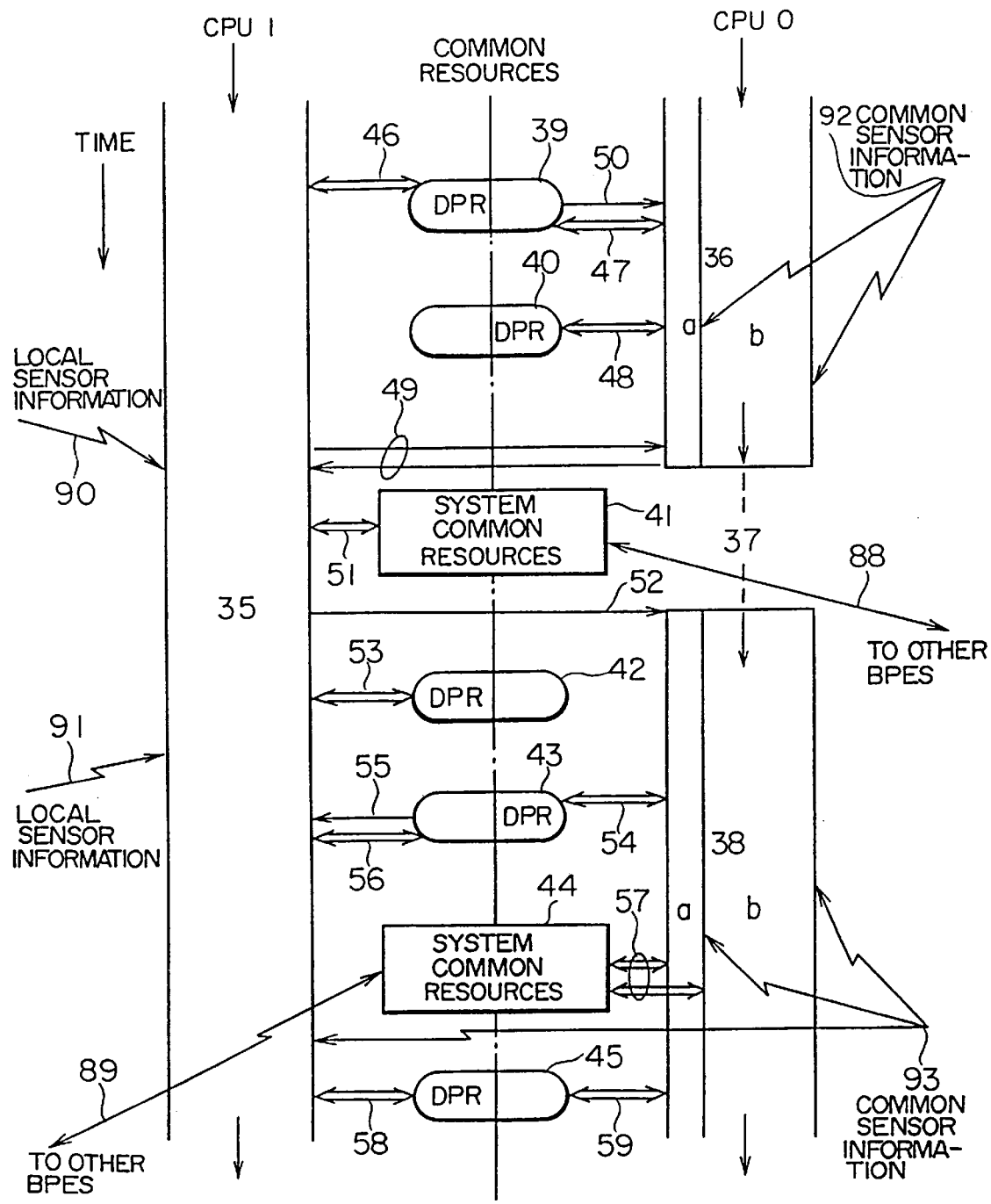
FIG. 3 is a diagram showing the sequence of processes carried out interactively between the two CPUs in the base processor element.

FIG. 3 is based on the assumption that CPU0 performs primary control arithmetics, while CPU1 backs up the CPU0 by implementing intelligent processing based on the intelligent base (distributed) and sensor information and also by implementing the system management, so that the system operates for local distributed processing. In the case of a multiprocessor configuration, each base processor element (BPE) is assumed to perform tight-linked parallel processing primarily and rough-linked parallel processing on a background basis. Reference number 35 shows the sequence of process by CPU1, and reference numbers 36, 37 and 38 show the sequence of processes by CPU0. Common resources include a dual-port RAM (DPR), which is a local memory shared by CPU0 and CPU1 in the base processor element (BPE), and system common resources on the system bus 14 accessible from all base processor elements (BPEs) in the case of a multiprocessor configuration. Symbols 47, 48, 54 and 59 indicate communications between CPU0 and DPR, while symbols 46, 53, 56 and 58 indicate communications between CPU1 and DPR. Similarly, symbols 57 and 51 indicate communications between CPU0 and system common resources and between CPU1 and system common resources, respectively, and these are regarded as accesses from base processor elements (BPEs) when observed from the system common resources. Symbol 50 indicates an interrupt to CPU0 by utilization of the interrupt function of the dual-port RAM (DPR), and symbol 55 indicates a similar interrupt to CPU1. Symbol 49 indicates a common bus access request signal issued by CPU1 to CPU0 and a corresponding bus access grant signal issued by CPU0 in the handshaking operation, and symbol 52 shows the transition of bus right which has once been acquired by CPU1 and is now released and returned to CPU0. Symbols 88 and 89 indicate accesses from other BPEs to the system common resources. Symbols 90 and 91 show receptions of external sensor information as part of intelligent information during the process of CPU1, and similarly symbols 92 and 93 show reception by CPU0 and CPU1 of sensor information shared with other BPEs. Concerning the processings performed by CPU0 and CPU1, the CPU0 operates as a main processing system to control, in unison with the CPU0s of other base processor elements (BPEs), part of an intelligent machine system, e.g., the arm of a human-type intelligent robot, by executing tight-linked parallel processes 36b and 38b among the CPU0s so that numerous control arithmetic tasks are treated at as high a parallelism as possible, and CPU implements as a background intelligent processing system in unison with CPU1 having the process 35 the intelligent processing and system management shown by 36a and 38a in the idle time after a process has been passed to an auxiliary processor, e.g., an arithmetic processor, the idle time which occurs during the synchronous process with other base processor element (BPE), and at a process request by interrupt from other base processor element (BPE), CPU1, or system common resources. The intelligent processing system carried out by the base process element (BPE) possesses as a data base information for a further smaller part of the robot arm portion, e.g., information related to muscles, receives related local sensor information as sense information, and executes the intelligent processing related to the muscular portion on the basis of the local function-distributed data base organized as above, thereby backing up the whole control arithmetics carried out by the main processing system.

For the foregoing assumed system, the sequence of processes by CPU0 and CPU1 shown in FIG. 3 will be traced briefly. Initially, CPU0 and CPU1 are performing their processes 36 and 35 shown in FIG. 3. CPU1 abruptly develops the need of communication with CPU0, and carries out the operation 46 at time point 39 for writing a communication message in the dual-port RAM (DPR) and writing a command for the message in the instruction register directed to CPU0. This operation generates an interrupt 50 to CPU0, causing the background processing system of CPU0 to access the dual-port RAM (DPR), and communication 47 for necessary information takes place. At time point 40, CPU0 meaninglessly writes and reads data shared with the partner CPU without handshaking to and from the dual-port RAM (DPR). Various sensor information is also processed sequentially or referenced by programs by being entered as interrupts raised by the sensors. Next, CPU1 develops the need of communication with a system common resource for the purpose of communication with another BPE, acquires the bus right for the common bus (BPE local bus) 12 at time point 49, has a communication 51 with the system common resource at time point 41, and after communication returns the bus right back to CPU0 at 52. During the above communication, CPU0 is held in a halt state 37 and, after the halt state has been lifted at 52, it proceeds to a process 38 continuative from the process 36. At the following time point 42, CPU1 has a meaningless communication of data shared among the CPUs with the dual-port RAM (DPR), and at 43 CPU0 has an instruction-attached handshake data communication with CPU1 in the same way as 39. At time point 44, CPU0 has a communication 57 with a system common resource, and in this case the communication includes one related to intelligent processing during the background process 38a and one for tight-linked parallel processing data related to control arithmetics during the main processing 38b, and these communications do not affect the process and operation of CPU1. Although symbol 45 indicates concurrent meaningless communications of CPU0 and CPU1 with the dual port RAM (DPR), the arbiter 60 performs proper arbitration control so that the communications take place without any inconvenience to their processes and operations.

When the foregoing intelligent processing system, formed of local distributed data bases and a control processing system backed up by it, is implemented by application of the inventive processor, most of the intelligent processes can be executed among the CPUs within the base processor element (BPE) through the dual-port RAM (DPR), with occasional access being made to the system common resources for transacting their process results and the intelligent process results provided by other base processor elements (BPEs), whereby the best communication throughput can be accomplished in a natural manner among the communication nodes within the system, and the consequent parallel operations, in virtually complete independence between the control processing system and intelligent processing system can double the processing ability. Furthermore, by the additional installation of BPEs, the processing ability of the intelligent processing system and control processing system is enhanced proportionally at well balanced grades between the systems.

According to this embodiment of the present invention, a processor element (base processor element: BPE) which is the fundamental component in constructing a multiprocessor system or single processor system is formed using two CPUs, which appear as a single CPU when observed from outside, linked through a dual-port RAM (DPR) with the interrupt function and a common bus shared by the CPUs. The two CPUs are alloted to a high-independence main processing system and background processing system separately, with local information exchange between the CPUs being made through the dual-port RAM (DPR) and communication with other base processor elements (BPEs), in the case of a multiprocessor configuration, being made by way of system common resources on the system bus through a common bus (BPE local bus), whereby the BPE ability is virtually doubled.

When a multiprocessor system is constructed using the inventive processor, where the data base for the background processing system is distributed to each BPE, the background processing system has most of the communication within each processor and does not necessitate frequent communication with other processors, and the consequent optimization of communication throughput among the communication nodes enables natural and high-efficiency parallel processings for both the main processing system and the background processing system without a significant influence of local communications on the tight-linked parallel process carried out by the main system. By additional installation of the inventive processor, the processing ability can be enhanced at well balanced grades between the main and background processing systems.

Next, the expansion of the inventive base processor element (BPE) to a multiprocessor system and an example of the intelligent robot system arranged by use of the multiprocessor system will be described with reference to FIG. 6.

Figure 6:
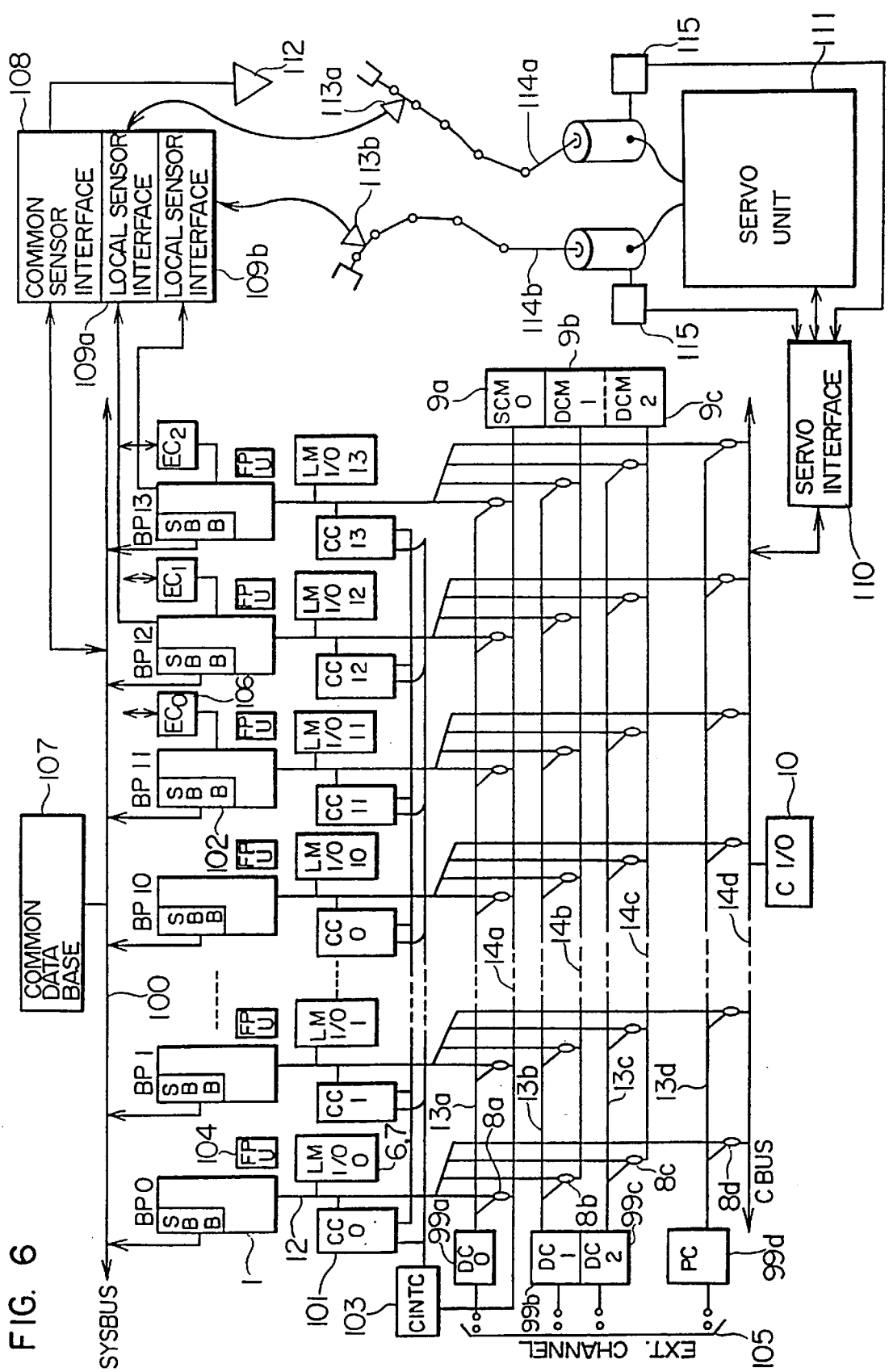
FIG. 6 is a block diagram showing another embodiment of this invention applied to an intelligent automatic machine.
Figure 7:
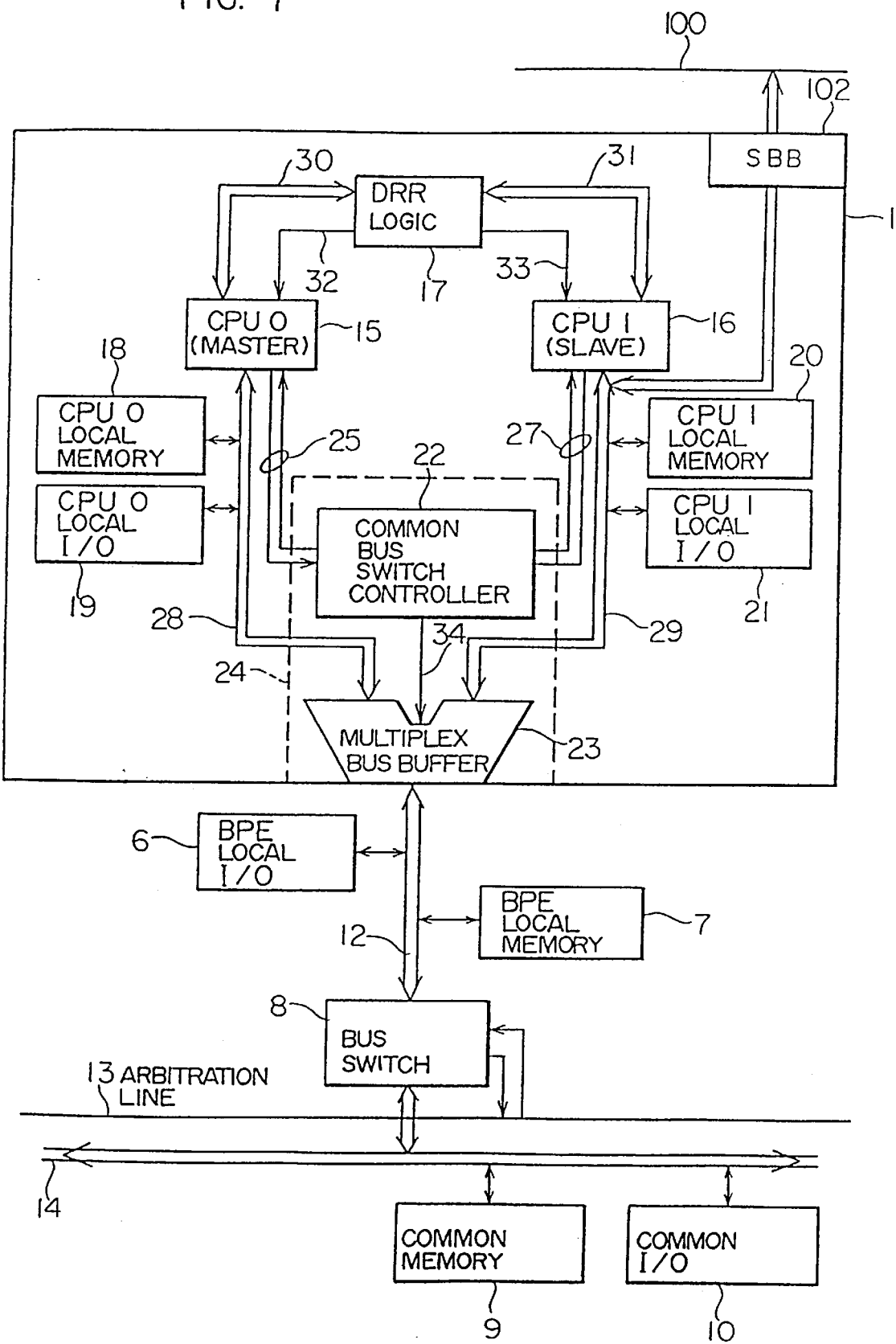
FIG. 7 is a block diagram showing the processor in the system of FIG. 6.

FIGS. 6 and 7 reference number 1 denotes base processor elements (BPEs) of this invention. Each base processor element 1 is connected to common buses 14a–14d by a BPE local bus 12. Symbols 99a–99d denote bus arbiters for the respective common buses 14a–14d, and symbols 13a–13d are associated arbitration lines. The common buses 14a–14c are private buses for shared memory systems 9a–9c, respectively, while the bus 14d is a bus for a common I/O unit 10. The four common buses have individual access rights normally taken by CPU0 (shown by 15 in FIG. 7) which is alloted to the control processing system in the BPE 1, and they are also used by CPU1 (shown by 16 in FIG. 7) which is alloted to the intelligent processing system when necessary. Accordingly, the common buses 14a–14d are roughly considered to be private buses for the control processing system.

CPU0 in each base processor element uses the common buses for communication and carries out necessary control arithmetics as tight-linked parallel processes.

Reference number 101 denotes a hardware unit (communication controller) for controlling parallel processings, and 103 denotes a hardware unit (communication interrupt controller) for controlling interrupt-based communications among base processor elements. The base processor element is provided with a bus switch circuit 102, which supports the system bus 100 as a common bus dedicated to the intelligent processing system, and, as seen in FIG. 7 a local bus for CPU1 which is alloted to the intelligent processing system. Placed on the system bus 100 are a common data base 107 and various shared sensors and interfaces. The local bus for CPU1 which is alloted to the control processing system is provided with a floating point arithmetic unit (FPU) 104 used for high-speed arithmetic operations.

The multiprocessor system of this embodiment comprises a total of 14 base processor elements, and the system in modules is provided with an external expansion channel 105 of the type of direct hardware communication unit linkage and an external expansion channel 106 of a software intervention type so that many modules can be linked together. The use of the external expansion channel 105 (hardware direct linkage type) allows high-speed reference to the internal common memories 9a–9c directly from an external module, while the use of the external expansion channel 106 (software intervention type) allows high-grade, flexible communications based on a certain protocol with other modules.

Using the base processor element arranged as described above, a multiprocessor system which effectively supports the control processing system and intelligent processing system, as described above, can be organized.

The multiprocessor system shown in FIG. 6 is linked with a robot system, as a control object, and it will be described in the following.

The robot system includes robot mechanisms 114a and 114b, a servo unit (including power amplifiers) 111, sensors 113a and 113b equipped on the robot mechanisms 114a and 114b, and another sensor, e.g., television camera, 112. The multiprocessor system of this embodiment performs a high-speed coordinate transforming process and a dynamic arithmetic process on the part of the control processing system, and delivers the resulting position, speed and acceleration commands to the servo unit 111 by way of a servo interface 110 on the common I/O bus. Conversely, the current operational state of the robot is detected using sensors 115 including encoders, tachometers, acceleration sensors and motor current sensors, and the servo unit 111 sends the results of detection as feedback data to the multiprocessor system by way of the servo interface 110. The control processing system in the multiprocessor system uses the feedback data and commands and data provided by the intelligent processing system to calculate subsequent command values to be fed to the servo unit 111. The sensor 112 shared by the two robot mechanisms 114a and 114b sends data to the system bus 100 through a common sensor interface 108, while the sensors 113a and 113b, provided individually on the robot mechanisms 114a and 114b send data directly to the intelligent processing systems of individually functioning base processor elements by way of local sensor interfaces 109a and 109b. Based on the information from the sensors 112, 113a and 113b and a common data base 107, the intelligent processing system performs intelligent processing operative including learning and inferring, and provides the results to the control processing system.

According to the above embodiment of this invention, the control processing system performs high-grade dynamic control arithmetics under the support of the high-grade intelligent process, and consequently an intelligent automatic machine control system, such as an intelligent robot, with sensing, inferring and learning functions, and abilities of high-speed and high-accuracy motions can be constructed.

According to the above embodiment of this invention, a base processor element, which constitutes the controller for an intelligent automatic machine control system such as an intelligent robot, can implement a control processing system and an intelligent processing system separately, whereby the processing abilities and functions of both systems can be expanded at well balanced grades in the single processor environment or multiprocessor environment. By providing in the base processor element a dual-port RAM dedicated to the local tight-linked communication between the intelligent processing system and control processing system and connecting the two systems directly to the associated CPUs, the possibility of communication disturbance in the control processing system and serious bus contention in the multiprocessor environment can be reduced significantly, whereby communication throughput between the systems and among functions can be made optimal.

By providing a bus switch interface (multiplexer bus buffer and common bus switch control circuit) of a master-slave type for supporting the common bus accessible from the two CPUs in the base processor element so that the base processor in dual-CPU formation is reformed to a single processor, base processors can easily be linked with a plurality of buses, whereby the processing ability and function can be expanded efficiently and uniformly.

According to this invention, as described above, the processing ability of the multiprocessor system or single processor system suitable for general-purpose processing operations can be enhanced efficiently at well balanced grades.

Moreover, according to this invention, the control processing system, which performs high-grade and high-load dynamic control arithmetic processing under the support of the intelligent processing system based on sensors and intelligent base, has functions of sensing inference and learning, and it accomplishes control for an intelligent automatic machine, such as an intelligent robot, which has high-speed and high-accuracy motion.

I claim:

1. A processor element for use in a system having a plurality of said processor elements and a system bus connected to a resource, each processor element being connected to said system bus through a common bus which is connected to a first switch for selectively connecting said common bus to said system bus, said processor element comprising:
    a first CPU which processes information supplied through said common bus;
    a second CPU which processes information supplied through said common bus;
    a storage connected between said first CPU and said second CPU, said storage stores information from either of said first and second CPU's and permits the other of said first and second CPU's to retrieve said stored information; and
    a second switch which switches said common bus, normally connected to said first CPU, in response to a signal requesting access to said common bus from said first or second CPU.

2. A processor element according to claim 1, wherein said second CPU is connected to a system bus which supplies information to said second CPU.

3. A processor element according to claim 1, wherein said first CPU has means for controlling said second switch to connect said second CPU to said common bus in response to a signal issued from said first CPU.

4. A processor element for processing information transferred through a common bus which is selectively connected to a system bus by a first switch, comprising:
    a first CPU which exclusively processes real time information supplied through said common bus;
    a second CPU which processes information other than real time information supplied through said common bus;
    a storage connected between said first CPU and said second CPU, said storage stores information from either of said first and second CPU's and permits the other of said first and second CPU's to retrieve said stored information; and
    a second switch which connects said common bus, normally connected to said first CPU, to said second CPU when said second CPU issues a signal requesting access to said common bus.

5. A processor element according to claim 4, wherein said second CPU is connected to a system bus which supplies information to said second CPU.

6. A processor element according to claim 4, wherein said first CPU has means for controlling said second switch to connect said second CPU to said common bus in response to a signal issued from said first CPU.

7. A processor element for controlling operation of at least one resource in a system having a plurality of said processor elements and a system bus connected to said resource, each processor element being connected to said system bus through a common bus which is connected to a first switch for selectively connecting said common bus to said system bus, said processor element comprising:
    a first CPU which performs a process in a predetermined time period;
    a second CPU which performs a process including at least a process other than said process performed in a predetermined time period; and
    a second switch which selectively connects said common bus to said first CPU or said second CPU to permit said first CPU or said second CPU to access said resource in response to a request from said second CPU;
    wherein either of said first and second CPU's refers to information processed by the other of said first and second CPU's.

8. A processor element for controlling operation of an object in response to feedback data from said object in a system having a plurality of said processor elements and a system bus connected to said object, each processor element being connected to said system bus through a common bus which is connected to a first switch for selectively connecting said common bus to said system bus, said processor element comprising:
    a first CPU which performs a process in response to said feedback data;
    a second CPU which performs a process including at least a process other than said process performed in response to said feedback data;
    means, connected between said first and second CPU's, for permitting either one of said first and second CPU's to refer to information processed by the other of said first and second CPU's, said information being transferred from the other CPU to the one CPU;

a resource which transfers information related to control of said object between said object and said first CPU or said second CPU; and a second switch which always connects said resource normally connected to said first CPU to said second CPU in response to a signal from said second CPU.

9. A processor element for controlling operation of an object in a system having a plurality of said processor elements and a system bus connected to said object, each processor element being connected to said system bus through a common bus which is connected to a first switch for selectively connecting said common bus to said system bus, said processor element comprising:

a first resource which transfers real time information related to control of operation of said object between said object and a first CPU;

a second resource which transfers information, other than said real time information, related to control of operation of said object between said object and a second CPU;

said first CPU processes said real time information in real time;

said second CPU processes said information other than said real time information;

means, connected between said first and second CPU's for permitting either one of said first and second CPU's to refer to information processed by the other of said first and second CPU's, said information being transferred from the other CPU to the one CPU; and a second switch which always connects said first resource, normally connected to said first CPU, to said second CPU in response to a signal from said second CPU.

10. A processor element for controlling operation of an object in a system having a plurality of said processor elements and a system bus connected to said object, each processor element being connected to said system bus through a common bus which is connected to a first switch for selectively connecting said common bus to said system bus, said processor element comprising:

a first CPU which performs a real time process related to control operation of said object in real time;

a second CPU which performs at least a process other than said real time process, related to control of operation of said object, means, connected between said first and second CPU's, for permitting either one of said first and second CPU's to refer to information processed by the other of said first and second CPU's, said information being transferred from the other CPU to the one CPU;

a resource which transfers information related to control of operation of said object between said object and said first CPU or said second CPU; and a second switch which always connects said resource, normally connected to said first CPU, to said second CPU in response to a signal from said second CPU.

11. A processor element for controlling operation of an object in a system having a plurality of said processor elements and a system bus connected to said object, each processor element being connected to said system bus through a common bus which is connected to a first switch for selectively connecting said common bus to said system bus, said processor element comprising:

a resource which stores real time information related to control of operation of said object and information, other than said real time information, related to control of operation of said object;

a first CPU which processes real time information from said resource in real time;

a second CPU which processes said information, other than said real time information, from said resource;

means connected between said first and second CPU's, for permitting either one of said first and second CPU's to refer to information processed by the other of said first and second CPU's, said information being transferred from the other CPU to the one CPU; and a second switch which always connects said resource, normally connected to said first CPU to said second CPU in response to a signal from said second CPU.

12. A processor system comprising:

a system bus;

a plurality of processor elements, each processor element including:

a common bus which transfers information, a first CPU which processes information supplied through said common bus, a second CPU which processes information supplied through said common bus, each processor element being connected to said system bus through said common bus which is connected to a first switch for selectively connecting said common bus to said system bus, a storage connected between said first CPU and said second CPU, said storage stores information from either of said first and second CPU's and permits the other of said first and second CPU's to retrieve said stored information, and a second switch which always connects said common bus to said first CPU except in response to a signal issued from said second CPU.

13. A processor element for controlling operation of at least one resource, said processor element comprising:

a first CPU which performs a process in a predetermined time period;

a second CPU which performs a process including at least a process other than said process performed in a predetermined time period; and a switch which permits said first CPU or said second CPU to access said resource in response to a request from said second CPU;

wherein either one of said first and second CPU's refers to information processed by the other of said first and second CPU's in response to an interrupt signal generated when the other CPU makes said information available to the one CPU.

14. A processor element for controlling operation of an object in response to feedback data from said object, said processor element comprising:

a first CPU which performs a process in response to said feedback data;

a second CPU which performs a process including at least a process other than said process performed in response to said feedback data;

means, connected between said first and second CPU's, for permitting either one of said first and second CPU's to refer to information processed by the other of said first and second CPU's in response to an interrupt signal generated when the other CPU makes said information available to the one CPU;

a resource which transfers information related to control of operation of said object between said object and said first CPU or said second CPU; and a switch which connects said resource normally connected to said first CPU to said second CPU in response to a signal from said second CPU.

15. A processor element for controlling operation of an object, said processor element comprising:
a first resource which transfers real time information related to control of operation of said object between said object and a first CPU;
a second resource which transfers information, other than said real time information, related to control of operation of said object between said object and a second CPU;
said first CPU processes said real time information in real time;
said second CPU processes said information other than said real time information;
means, connected between said first and second CPU's for permitting either one of said first and second CPU's to refer to information processed by the other of said first and second CPU's, in response to an interrupt signal generated when the other CPU makes said information available to the one CPU; and
a switch which always connects said first resource, normally connected to said first CPU, to said second CPU in response to a signal from said second CPU.

16. A processor element for controlling operation of an object, said processor element comprising:
a first CPU which performs a real time process related to control of operation of said object in real time;
a second CPU which performs at least a process other than said real time process, related to control of operation of said object,
means, connected between said first and second CPU's, for permitting either one of said first and second CPU's to refer to information processed by the other of said first and second CPU's in response to an interrupt signal generated when the other CPU makes said information available to the one CPU;
a resource which transfers information related to control of operation of said object between said object and said first CPU or said second CPU; and
a switch which always connects said resource, normally connected to said first CPU, to said second CPU in response to a signal from said second CPU.

17. A processor element for controlling operation of an object, said processor element comprising:
a resource which stores real time information related to control of operation of said object and information, other than said real time information, related to control of operation of said object;
a first CPU which processes real time information from said resource in real time;
a second CPU which processes said information, other than said real time information from said resource;
means connected between said first and second CPU's, for permitting either one of said first and second CPU's to refer to information processed by the other of said first and second CPU's in response to an interrupt signal generated when the other CPU makes said information available to the one CPU; and
a switch which connects said resource, normally connected to said first CPU, to said second CPU in response to a signal requesting access to said resource from said second CPU.

18. A processor system comprising:
a plurality of processor elements, each processor element including:
a common bus which transfers information,
a first CPU which processes information supplied through said common bus,
a second CPU which processes information supplied through said common bus,
a logic device having a storage, and connected between said first CPU an said second CPU, said storage stores information from either one of said first and second CPU's and permits the other of said first and second CPU's to retrieve said stored information, said logic device in response to the storing of information from any one of said first and second CPU's generates an interrupt signal to the other of said first and second CPU's causing the other of said first and second CPU's to retrieve said stored information; and
a switch which connects said common bus, normally connected to said first CPU to said second CPU in response to a signal requesting access to said common bus issued from said second CPU.

19. A processor element for controlling operation of an object in response to feedback data from said object, said processor element comprising:
a first CPU which exclusively performs a real time process in response to said feedback data;
a second CPU which performs a process including at least a process other than said real time process performed in response to said feedback data;
means, connected between said first and second CPU's, for permitting either one of said first and second CPU's to refer to information processed by the other of said first and second CPU's;
a resource which transfers information related to control of operation of said object between said object and said first CPU or said second CPU; and
a switch which connects said resource normally connected to said first CPU to said second CPU in response to a signal requesting access to said resource from said second CPU.

20. A processor element for controlling operation of an object, said processor element comprising:
a first resource which transfers real time information related to control of operation of said object between said object and a first CPU;
a second resource which transfers information, other than said real time information, related to control of operation of said object between said object and a second CPU;
said first CPU exclusively processes said real time information in real time;
said second CPU processes said information other than said real time information;
means, connected between said first and second CPU's for permitting either one of said first and second CPU's to refer to information processed by the other of said first and second CPU'S; and
a switch which connects said first resource, normally connected to said first CPU, to said second CPU in response to a signal requesting access to said first resource from said second CPU.

21. A processor element for controlling operation of an object, said processor element comprising:

a first CPU which exclusively performs a real time process related to control of operation of said object in real time;

a second CPU which performs at least a process other than said real time process, related to control of operation of said object, means, connected between said first and second CPU's, for permitting either one of said first and second CPU's to refer to information processed by the other of said first and second CPU's;

a resource which transfers information related to control of operation of said object between said object and said first CPU or said second CPU; and a switch which connects said resource, normally connected to said first CPU, to said second CPU in response to a signal requesting access to said resource from said second CPU.

22. A processor element for controlling operation of an object, said processor element comprising:

a resource which stores real time information related to control of operation of said object and information, other than said real time information, related to control of operation of said object;

a first CPU which exclusively processes real time information from said resource in real time;

a second CPU which processes said information, other than said real time information from said resource;

means connected between said first and second CPU's, for permitting either one of said first and second CPU's to refer to information processed by the other of said first and second CPU's; and a switch which connects said resource, normally connected to said first CPU, to said second CPU in response to a signal requesting access to said resource from said second CPU.

23. A processor system comprising:

a plurality of processor elements, each processor element including:
  a common bus which transfers information,
  a first CPU which exclusively processes real time information supplied through said common bus,
  a second CPU which processes information other than said real time information supplied through said common bus,
  a storage connected between said first CPU an said second CPU, said storage stores information from either one of said first and second CPU's and permits the other of said first and second CPU's to retrieve said stored information, and
  a switch which connects said common bus normally connected to said first CPU to said second CPU in response to a signal requesting access to said common bus from said second CPU.

24. A processor element for processing information transferred through a common bus and for controlling operation of at least one resource, comprising:

a first CPU which performs a real time process on real time information supplied through said common bus in a predetermined time period;

a second CPU which processes information supplied through said common bus and which performs processes including at least a process other than said real time process on information other than real time information in a predetermined time period; and a logic device having a storage, and connected between said first CPU and said second CPU, said storage stores information from either of said first and second CPU's and permits the other of said first and second CPU's to retrieve said stored information, said logic device in response to the storing of information from any one of said first and second CPU's generates an interrupt signal to the other of said first and second CPU's causing the other of said first and second CPU's to retrieve said stored information; and a switch which switches said common bus, normally connected to said first CPU, to said second CPU in response to a signal requesting access to said common bus from said second CPU, thereby permitting said second CPU to access said at least one resource in response to a request from said second CPU;

wherein either one of said first and second CPU's refers to said stored information having been processed by the other of said first and second CPU's.

25. A processor system for controlling a resource comprising:

a first CPU which performs a control operation of said resource;

a second CPU which performs a background processing other than said control operation;

a memory provided between said first and second CPUs, said memory stores information required for said control operation performed by said first CPU and information required for the background processing performed by said second CPU and is controlled to output information required by one of said first and second CPUs or the opposite CPU; and a switch which connects a common bus, normally connected to said first CPU, to said second CPU in response to a request for access to said common bus from said second CPU, said common bus being connected to said resource.

26. A processor system according to claim 25, wherein said background processing is shared by said first or said second CPU.

27. A processor system for controlling a resource comprising:

a first CPU which performs a control operation of said resource;

a second CPU which performs a background processing other than said control operation;

a memory provided between said first and second CPUs, said memory stores information required for said control operation performed by said first CPU and information required for said background processing performed by said second CPU and is controlled to output information required by one of said first and second CPUs or the opposite CPU; and a switch which connects a common bus, normally connected to said first CPU, said second CPU in response to a request for access to said common bus from said second CPU, said common bus being connected to said resource.

* * * * *